(12) United States Patent
Luo

(10) Patent No.: US 11,925,056 B2
(45) Date of Patent: Mar. 5, 2024

(54) PACKAGE COVER PLATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 298 days.

(21) Appl. No.: 17/487,969

(22) Filed: Sep. 28, 2021

(65) Prior Publication Data
US 2022/0255040 A1 Aug. 11, 2022

(30) Foreign Application Priority Data
Feb. 8, 2021 (CN) .......................... 202110181796.5

(51) Int. Cl.
| | |
|---|---|
| H01L 51/52 | (2006.01) |
| H01L 27/32 | (2006.01) |
| H01L 51/56 | (2006.01) |
| H10K 50/824 | (2023.01) |
| H10K 50/84 | (2023.01) |
| H10K 50/842 | (2023.01) |
| H10K 59/00 | (2023.01) |
| H10K 71/00 | (2023.01) |
| H10K 59/38 | (2023.01) |

(52) U.S. Cl.
CPC ......... *H10K 50/846* (2023.02); *H10K 50/824* (2023.02); *H10K 50/8428* (2023.02); *H10K 59/00* (2023.02); *H10K 71/00* (2023.02); *H10K 59/38* (2023.02)

(58) Field of Classification Search
CPC ............ H10K 50/824; H10K 50/8428; H10K 50/846; H10K 59/80522; H10K 59/8723; H10K 59/874
See application file for complete search history.

(56) References Cited

U.S. PATENT DOCUMENTS

| | | | | |
|---|---|---|---|---|
| 2010/0096655 | A1* | 4/2010 | Lee | H10K 71/50 257/98 |
| 2014/0077171 | A1* | 3/2014 | Yamakita | H10K 71/00 257/40 |
| 2014/0252317 | A1* | 9/2014 | Gupta | H10K 50/805 257/40 |

(Continued)

FOREIGN PATENT DOCUMENTS

CN 110289366 A * 9/2019 .......... H10K 50/822

OTHER PUBLICATIONS

Machine translation, Luo, Chinese Pat. Pub. No. CN-110289366-A, translation date: Sep. 18, 2023, Espacenet, all pages. (Year: 2023).*

*Primary Examiner* — Victoria K. Hall
(74) *Attorney, Agent, or Firm* — Myers Bigel, P.A.

(57) ABSTRACT

The embodiments of the present application provide a package cover plate and a manufacturing method thereof, a display panel and a display device. The package cover plate includes a cover plate structure layer, a spacer structure on a side of the cover plate structure layer, the spacer structure includes a first spacer, and the first spacer includes a water absorbing structure, and an auxiliary electrode layer on a side of the spacer structure facing away from the cover plate structure layer.

15 Claims, 5 Drawing Sheets

(56) References Cited

U.S. PATENT DOCUMENTS

| | | | |
|---|---|---|---|
| 2016/0233458 A1* | 8/2016 | Shen | H10K 59/35 |
| 2017/0125508 A1* | 5/2017 | Kim | H10K 50/824 |
| 2019/0058012 A1* | 2/2019 | Song | H10K 59/1315 |
| 2019/0058153 A1* | 2/2019 | Luo | H10K 50/824 |
| 2020/0212349 A1* | 7/2020 | Li | H10K 50/8426 |
| 2021/0408126 A1* | 12/2021 | Li | G02B 5/201 |

* cited by examiner

PACKAGE COVER PLATE AND MANUFACTURING METHOD THEREOF, DISPLAY PANEL AND DISPLAY DEVICE

RELATED APPLICATION

The present application claims the benefit of Chinese Patent Application No. 202110181796.5, filed on Feb. 8, 2021, the entire disclosure of which is incorporated herein by reference.

TECHNICAL FIELD

The present disclosure relates to the display technology, in particular to a package cover plate and a manufacturing method thereof, a display panel and a display device.

BACKGROUND

Organic Light-Emitting Diode (OLED) is a display lighting technology that has gradually developed in recent years. Especially in the display industry, OLED displays are considered to have a wide range of application prospects due to their advantages of high response, high contrast, and flexibility. Top-emission OLED display devices have become the main research direction due to their high aperture ratio.

SUMMARY

According to a first aspect of the present disclosure, a package cover plate is provided. The package cover plate comprises: a cover plate structure layer; a spacer structure on a side of the cover plate structure layer, the spacer structure comprises a first spacer, and the first spacer comprises a water absorbing structure; and an auxiliary electrode layer on a side of the spacer structure facing away from the cover plate structure layer.

In some embodiments, the water absorbing structure is a material of the first spacer doped with desiccant particles.

In some embodiments, a particle size of the desiccant particles ranges from 20 nm to 50 nm; and/or the desiccant particles comprise at least one of calcium oxide particles, barium oxide particles, and calcium chloride particles; and/or a volume ratio of the desiccant particles in the first spacer ranges from 20% to 40%.

In some embodiments, the first spacer has a columnar structure, an outer diameter of the first spacer ranges from 15 μm to 20 μm, and a height of the first spacer ranges from 2 μm to 8 μm.

In some embodiments, the spacer structure further comprises a lyophobic layer, and the lyophobic layer is on a side of the first spacer facing away from the cover plate structure layer.

In some embodiments, the spacer structure further comprises a second spacer, and the second spacer is on a side of the first spacer facing away from the cover plate structure layer, and an orthographic projection of the second spacer on the cover plate structure layer covers an orthographic projection of the first spacer on the cover plate structure layer.

In some embodiments, at least a part of a surface of the second spacer facing away from the first spacer comprises a lyophobic layer.

In some embodiments, a material of the second spacer comprises at least one of polyimide, polymethyl methacrylate, and organosilane; and/or an outer diameter of the second spacer ranges from 20 μm to 30 μm; and/or a height of the second spacer ranges from 5 μm to 10 μm; and/or the lyophobic layer is a lyophobic structure obtained by using at least one of tetrafluoromethane, fluorinated silane, and chlorosiloxane to perform lyophobic treatment on at least a part of the surface of the second spacer that faces away from the first spacer.

In some embodiments, the spacer structure further comprises a lyophobic layer on a side of the second spacer facing away from the cover plate structure layer.

In some embodiments, a material of the second spacer comprises at least one of polyimide, polymethyl methacrylate, and organosilane; and/or an outer diameter of the second spacer ranges from 20 μm to 30 μm; and/or a height of the second spacer ranges from 5 μm to 10 μm; and/or a material of the lyophobic layer comprises at least one of fluorinated polyimide, fluorinated polymethyl methacrylate, and polysiloxane.

In some embodiments, a material of the first spacer may comprise a lyophobic material.

In some embodiments, a material of the second spacer comprises a lyophobic material.

According to a second aspect of the present disclosure, a manufacturing method for a package cover plate is provided. The method comprises: forming a cover plate structure layer; forming a spacer structure on a side of the cover plate structure layer, the spacer structure comprising a first spacer on a side of the cover plate structure layer, the first spacer comprising a water absorbing structure; and forming an auxiliary electrode layer on a side of the spacer structure facing away from the cover plate structure layer.

In some embodiments, the forming a spacer structure on a side of the cover plate structure layer comprises: forming a first spacer is on a side of the cover plate structure layer, and a material of the first spacer is doped with desiccant particles.

In some embodiments, the forming a spacer structure on a side of the cover plate structure layer further comprises: forming a second spacer on a side of the first spacer facing away from the cover plate structure layer, an orthographic projection of the second spacer on the cover plate structure layer covering an orthographic projection of the first spacer on the cover plate structure layer; and performing lyophobic treatment on at least a part of a surface of the second spacer facing away from the first spacer to form a lyophobic layer on a side of the first spacer facing away from the cover plate structure layer; wherein at least one of tetrafluoromethane, fluorinated silane, and chlorosiloxane is used to perform lyophobic treatment on the second spacer.

In some embodiments, the forming a spacer structure on a side of the cover plate structure layer further comprises: forming a second spacer film on a side of the first spacer facing away from the cover plate structure layer; forming a lyophobic film on a side of the second spacer film facing away from the cover plate structure layer; and patterning the second spacer film and the lyophobic film to form a second spacer and a lyophobic layer, an orthographic projection of the second spacer on the cover plate structure layer covering an orthographic projection of the first spacer on the cover plate structure layer, and the lyophobic layer being on a side of the second spacer facing away from the cover plate structure layer.

According to a third aspect of the present disclosure, a display panel is provided. The display panel comprises the package cover plate described in foregoing embodiments and a display substrate, the package cover plate being arranged opposite to the display substrate, and the display substrate comprising a top electrode on a side facing the package cover plate, the auxiliary electrode layer in the package cover plate is coupled with the top electrode.

In some embodiments, the water absorbing structure is a material of the first spacer doped with desiccant particles.

In some embodiments, the particle size of the desiccant particles ranges from 20 nm to 50 nm; and/or the desiccant particles comprise at least one of calcium oxide particles, barium oxide particles, and calcium chloride particles; and/or the volume ratio of the desiccant particles in the first spacer ranges from 20% to 40%.

According to a fourth aspect of the present disclosure, a display device is provided. The display device comprises the display panel described in the foregoing embodiments.

BRIEF DESCRIPTION OF THE DRAWINGS

In the drawings, unless otherwise specified, the same reference numerals refer to the same or similar parts or elements throughout the multiple drawings. The drawings are not necessarily drawn to scale. It should be understood that these drawings only depict some embodiments of the present disclosure, and should not be regarded as limiting the scope of the present disclosure.

DETAILED DESCRIPTION OF THE DISCLOSURE

In the following, only some exemplary embodiments are briefly described. As those skilled in the art can realize, the described embodiments may be modified in various different ways without departing from the spirit or scope of the present disclosure. Therefore, the drawings and the description are to be regarded essentially as illustrative and not restrictive.

For a top-emission OLED structure, the top electrode as the light-emitting surface of the OLED must have good light transmittance. At present, the top-emission transparent electrodes are mostly materials such as thin metals, indium tin oxide, indium zinc oxide. Due to the poor transmittance of metals, their use as large-area electrodes after thinning is likely to cause an increase in resistance, which is not conducive to the development of large-size devices.

Existing top-emission OLED display devices have black spots in the display, and the service life of the display device needs to be improved.

In order to reduce the resistance of the top electrode in the top-emission OLED structure, an auxiliary electrode can be fabricated on the package cover plate to reduce the resistance of the top-emission transparent electrode in the related art. However, it is easy to accumulate water vapor during the manufacturing process of the package cover plate, and the water vapor remains in the package cover plate. After the package cover plate and the display substrate are packaged, water vapor is easily transmitted to the display substrate, causing corrosion to the display substrate, forming black spots, and affecting the service life of the display substrate.

Figure 1:
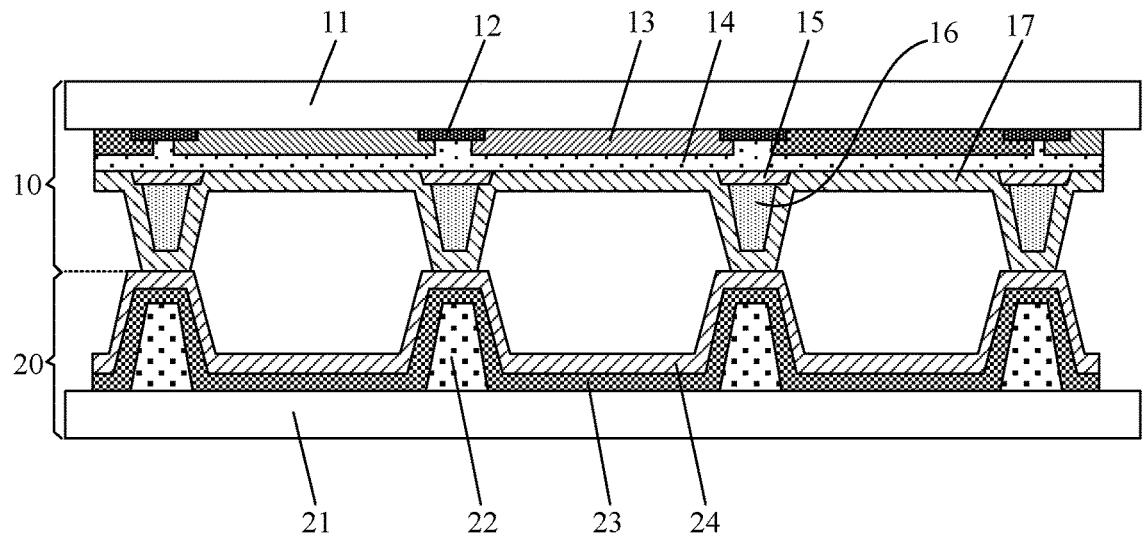
FIG. 1 is a schematic structural diagram of a display panel according to the related art.

FIG. 1 is a schematic structural diagram of a display panel according to the related art. As shown in FIG. 1, the display panel may include a package cover plate 10 and a display substrate 20, and the package cover plate 10 is arranged opposite to the display substrate 20. The display substrate 20 may include a driving substrate 21. A pixel defining layer (PDL) 22 is provided on a side of the driving substrate 21 facing the package cover plate 10, and the pixel defining layer 22 defines a pixel area. A side of the pixel defining layer 22 facing away from the driving substrate 21 is provided with an organic functional layer 23, and a side of the organic functional layer 23 facing away from the driving substrate 21 is provided with a top electrode 24. The top electrode 24 may be a cathode. The driving substrate 21 may include a bottom electrode (not shown in the figure), the bottom electrode is in the pixel area, and the bottom electrode may be an anode. The bottom electrode, the organic functional layer 23 and the top electrode 24 in the pixel area can form an OLED device, and the OLED device emits light under the action of the voltage between the bottom electrode and the top electrode 24 for display.

The package cover plate 10 may include a cover plate 11, a black matrix (BM) 12 provided on a side of the cover plate 11 and a color film structure layer 13. The black matrix 12 is arranged corresponding to the pixel defining layer 22. The color film (CF) structure layer 13 may include a red color film, a green color film, and a blue color film. A side of the color film structure layer 13 facing away from the cover plate 11 is provided with a planarization layer 14, a side of the planarization layer 14 facing away from the cover plate 11 is provided with an auxiliary electrode column 15, and a side of the auxiliary electrode column 15 facing away from the cover plate 11 is provided with a spacer 16. The auxiliary electrode column 15 is arranged corresponding to the black matrix 12, an orthographic projection of the spacer 16 on the cover plate 11 is in an orthographic projection of the auxiliary electrode column 15 on the cover plate 11, and the orthographic projection of the spacer 16 on the cover plate 11 is smaller than the orthographic projection of the auxiliary electrode column 15 on the cover plate 11. An auxiliary electrode layer 17 is provided on a side of the spacer 16 facing away from the cover plate 11. Since the orthographic projection of the spacer 16 on the cover plate 11 is smaller than the orthographic projection of the auxiliary electrode column 15 on the cover plate 11, the auxiliary electrode layer 17 is connected to the auxiliary electrode column 15.

During the packaging process of the package cover plate 10 and the display substrate 20, the spacer 16 extrudes the packaging glue material so that the auxiliary electrode layer 17 of the package cover plate 10 contacts the top electrode 24 of the display substrate 20. Therefore, both the auxiliary electrode layer 17 and the auxiliary electrode column 15 are connected to the top electrode 24, so as to reduce the resistance of the top electrode 24 and strengthen the conductivity of the top electrode 24. However, the color film structure layer 13 of the package cover plate 10 is made of organic materials, which tends to accumulate water vapor during the preparation process, and the water vapor remains in the package cover plate 10. After the packaging of the package cover plate 10 and the display substrate 20 is completed, the water vapor remaining in the package cover plate 10 is easily transmitted along the spacers 16 to the OLED device of the display substrate 20, causing corrosion to the electrode and the organic functional layer of the OLED device, forming black spots, and affecting the service life of OLED devices.

Figure 2:
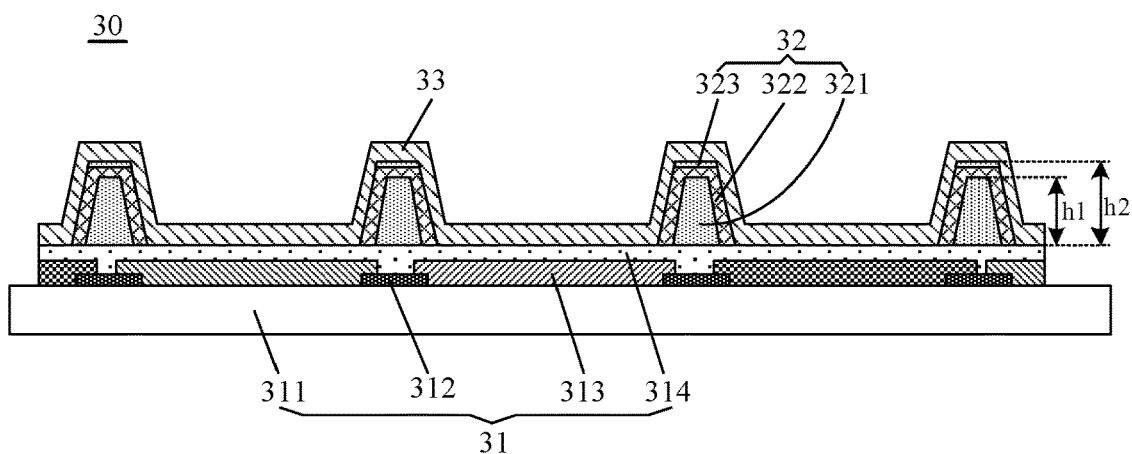
FIG. 2 is a schematic structural diagram of a package cover plate according to an embodiment of the disclosure.

FIG. 2 is a schematic structural diagram of a package cover plate according to an embodiment of the disclosure. As shown in FIG. 2, a package cover plate 30 may include a cover plate structure layer 31, a spacer structure 32 and an auxiliary electrode layer 33. The spacer structure 32 is on a side of the cover plate structure layer 31, the spacer structure 32 may include a first spacer 321, and the first spacer 321 may include a water absorbing structure. The auxiliary electrode layer 33 is on a side of the spacer structure 32 facing away from the cover plate structure layer 31. The spacer structure 32 is configured to block the diffusion of water vapor along the spacer structure 32 toward the auxiliary electrode layer 33.

It can be understood that the package cover plate can be applied to a display panel. In the display panel, the package cover plate can be packaged opposite to the display substrate, and the auxiliary electrode layer 33 is configured to couple with the top electrode of the display substrate to reduce the resistance of the top electrode. In the related art, as shown in FIG. 1, the water vapor remaining in the package cover plate is easily transmitted along the spacer 16 to the OLED device of the display substrate 20, causing corrosion to the electrode and organic functional layer of the OLED device, forming black spots, and affecting the service life of OLED devices.

According to the technical solution of the embodiment of the present disclosure, the spacer structure 32 may include a first spacer 321, the first spacer 321 may include a water absorbing structure, the water absorbing structure can absorb water vapor, and the spacer structure can prevent water vapor from being transmitted to the auxiliary electrode layer along the spacer structure, which can prevent water vapor from being transmitted to the top electrode and the organic functional layer of the display substrate. In this way, it is possible to prevent the water vapor remaining in the package cover plate from corroding the OLED devices in the display substrate, avoid black spots, and improve the display effect and service life of the display panel.

In an implementation, the cover plate structure layer 31 may include a cover plate 311, a black matrix 312, a color film structure layer 313 and a planarization layer 314. The cover plate 311 may be glass. The black matrix 312 is on a side of the cover plate 311. It can be understood that the black matrix 312 is arranged corresponding to the pixel defining layer in the display substrate. The color film structure layer 313 is on a side of the black matrix 312 facing away from the cover plate 311. The color film structure layer may include a red color film, a green color film, and a blue color film. The planarization layer 314 is on a side of the color film structure layer 313 facing away from the cover plate 311. The material of the planarization layer 314 may include a resin material with elasticity. Exemplarily, the material of the planarization layer 314 may include at least one of a phenol resin, a polypropylene resin, a polyimide resin, an acrylic resin, and the like. The planarization layer 314 covers the black matrix 312 and the color film structure layer 313, and the thickness of the planarization layer 314 may range from 1 μm to 2 μm.

In an implementation, the spacer structure 32 is arranged corresponding to the black matrix 312.

In an implementation, the first spacer 321 is on a side of the cover plate structure layer 31, for example, the first spacer 321 is on the side of the planarization layer 314 facing away from the cover plate 311. The water absorbing structure is that the material of the first spacer 321 is doped with desiccant particles, and the desiccant particles are used to absorb water vapor.

When the water vapor is transmitted to the first spacer 321, the desiccant particles in the first spacer 321 can absorb the water vapor, block the water vapor from diffusing toward the auxiliary electrode layer 33, and then can block the water vapor from diffusing toward the OLED in the display substrate.

In an implementation, the first spacer 321 is a columnar structure, and the cross-sectional shape of the first spacer 321 in a plane parallel to the cover plate 311 can be set according to actual needs, for example, it can be at least one of shapes of a circle, a square, etc. As shown in FIG. 2, the outer diameter of the first spacer 321 may range from 15 μm to 20 μm. For example, the outer diameter of the first spacer 321 may be any value of 15 μm, 16 μm, 17 μm, 18 μm, 19 μm, and 20 μm. The outer diameter of the first spacer 321 is the dimension of the first spacer in the direction parallel to the cover plate 311. When the cross section of the first spacer is a circle, the outer diameter of the first spacer may be the diameter of the cross section of the first spacer. When the first spacer is non-circular, the outer diameter of the first spacer may be the largest dimension of the cross section of the first spacer. The height h1 of the first spacer 321 may range from 2 μm to 8 μm. For example, the height of the first spacer 321 may be any value of 2 μm, 3∥m, 4 μm, 5 μm, 6 μm, 7 μm, and 8 μm.

In an implementation, the material of the first spacer 321 may also include an organic material (for example, a photoresist material), and the desiccant particles are doped in the organic material. Exemplarily, the desiccant particles are uniformly distributed in the organic material. The organic material may include at least one of polyimide, bisphenol A polycarbonate, a polymer containing an alkyl group in the main chain, a polymer containing a cyclic rigid structure in the main chain, and the like. The desiccant particles are doped in the organic material, so that the outside of the desiccant particles is wrapped by the organic material, which can prevent the desiccant particles from failing due to untimely absorbing a large amount of external water vapor. Therefore, after the package cover plate and the display substrate are packaged, the desiccant particles can be better used to absorb the residual water vapor of the package cover plate.

Exemplarily, the particle size of the desiccant particles ranges from 20 nm to 50 nm, and the particle size of the desiccant particles can be any value from 20 nm to 50 nm. For example, the particle size of the desiccant particles can be any value of 20 nm, 30 nm, 40 nm and 50 nm. If the particle size of the desiccant particles is less than 20 nm, the effect of absorbing water vapor is not good. If the particle size of the desiccant particles is greater than 50 nm, it may affect the formed first spacer. The particle size of the desiccant particles are set to range from 20 nm to 50 nm, so that the desiccant particles can better absorb water vapor, and particles of this size will not affect the formed first spacer, thereby improving the display effect of the display panel. The desiccant particles may include at least one of calcium oxide (CaO) particles, barium oxide (BaO) particles, and calcium chloride ($CaCl_2$) particles. The volume ratio of the desiccant particles in the first spacer material may range from 20% to 40%. For example, the volume ratio of the desiccant particles in the first spacer material may be any value of 20%, 25%, 30%, 35% and 40%.

In an implementation, the spacer structure 32 may further include a lyophobic layer 323. The lyophobic layer 323 may be on a side of the first spacer 321 facing away from the cover plate structure layer. Thus, the lyophobic layer 323 is between the first spacer 321 and the auxiliary electrode layer 33.

When the desiccant particles cannot completely absorb the water vapor remaining in the package cover plate, the water vapor will remain on the surface of the spacer structure 32, and then enter the display substrate through the auxiliary electrode layer 33, causing defects. In an embodiment of the present disclosure, the lyophobic layer 323 is provided. Since the lyophobic layer 323 is hydrophobic, it can prevent water vapor from remaining on the surface of the first spacer 321, and the lyophobic layer 323 can block water vapor from entering the auxiliary electrode layer 33 through the lyophobic layer 323, thereby avoiding defects caused by water vapor remaining on the surface of the spacer structure, which further improves the barrier property of the spacer structure to water vapor, and further improves the display effect and service life of the display panel.

In an implementation, as shown in FIG. 2, the spacer structure may further include a second spacer 322, which is on a side of the first spacer 321 facing away from the cover plate structure layer, and an orthographic projection of the second spacer 322 on the cover plate structure layer covers an orthographic projection of the first spacer 321 on the cover plate structure layer. Exemplarily, the boundary of the orthographic projection of the second spacer 322 on the cover plate structure layer is located outside of the boundary of the orthographic projection of the first spacer 321 on the cover plate structure layer, so that the second spacer 322 covers the outer surface of the first spacer 321. The material of the second spacer 322 may include a photoresist material. For example, the material of the second spacer 322 may include at least one of polyimide, polymethyl methacrylate, and organosilane. The outer diameter of the second spacer 322 may range from 20 μm to 30 μm. For example, the outer diameter of the second spacer 322 may be any value of 20 μm, 22 μm, 24 μm, 26 μm, 28 μm, and 30 μm. It can be understood that the outer diameter of the second spacer is the dimension of the second spacer in a direction parallel to the cover plate. The cross-sectional shape of the second spacer may correspond to the cross-sectional shape of the first spacer.

In an implementation, the height h2 of the second spacer 322 may range from 5 μm to 10 μm. For example, the height of the second spacer 322 may be any value of 5 μm, 6 μm, 7 μm, 8 μm, 9 μm, and 10 μm. The height of the second spacer is the distance between the surface of the second spacer on the side facing away from the cover plate and the planarization layer, as indicated by h2 in FIG. 2.

By providing the second spacer 322 covering the outer surface of the first spacer 321, the second spacer 322 can wrap the first spacer 321, confine water vapor in the first spacer 321, and can further block external water vapor from entering the first spacer 321, the desiccant particles in the first spacer 321 are further prevented from failing due to absorbing external water vapor. Therefore, after the package cover plate and the display substrate are packaged, the desiccant particles can be better used to absorb the residual water vapor of the package cover plate.

In an implementation, the second spacer 322 may be subjected to lyophobic treatment to obtain a lyophobic layer 323, as shown in FIG. 2. Exemplarily, the lyophobic layer is a lyophobic structure obtained by using at least one of tetrafluoromethane, fluorinated silane, and chlorosiloxane to perform lyophobic treatment on at least a part of the surface of the second spacer that faces away from the first spacer. For example, at least one of tetrafluoromethane, fluorinated silane, and chlorosiloxane can be used to perform surface treatment on at least a part of the surface of the second spacer 322 facing away from the cover plate 311, so that at least a part of the surface of the second spacer 322 facing away from the cover plate 311 is lyophobic (which may also be called hydrophobic). The thickness of the lyophobic layer 323 can be set according to the lyophobic treatment process or according to actual needs.

In an implementation, as shown in FIG. 2, the material of the auxiliary electrode layer 33 may include a transparent conductive material. Exemplarily, the material of the auxiliary electrode layer 33 may include at least one of indium zinc oxide, indium tin oxide, etc. The thickness of the auxiliary electrode layer 33 may range from 10 nm to 100 nm. For example, the thickness of the auxiliary electrode layer 33 may be any value of 10 nm, 20 nm, 30 nm, 40 nm, 50 nm, 60 nm, 70 nm, 80 nm, 90 nm, and 100 nm. In actual implementation, the thickness of the auxiliary electrode layer 33 can be set according to actual needs.

In an implementation, the material of the auxiliary electrode layer may be a metal material. For example, the material of the auxiliary electrode layer may include one of metals of magnesium (Mg), silver (Ag), molybdenum (Mo), neodymium (Nd), aluminum (Al), and the like. When the material of the auxiliary electrode layer is a non-transparent material, the auxiliary electrode layer may be arranged in a grid structure with intersected horizontal and vertical lines, and the spacer structure may be at the grid intersection position of the auxiliary electrode layer. Exemplarily, the auxiliary electrode layer may be arranged corresponding to the black matrix, or the auxiliary electrode layer may be arranged corresponding to the pixel defining layer in the display substrate. Therefore, the hollow area defined by the grid-shaped auxiliary electrode layer corresponds to the pixel area. In this way, it is possible to prevent the auxiliary electrode layer from affecting the aperture ratio of the display panel.

Figure 3:
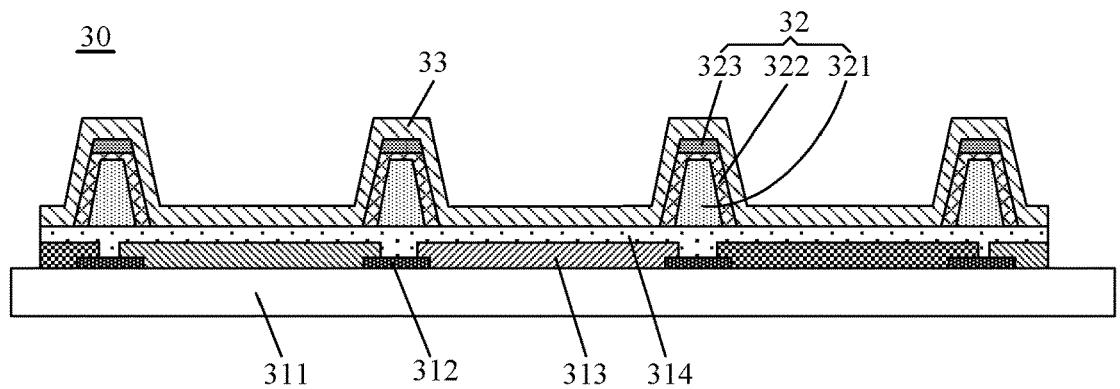
FIG. 3 is a schematic structural diagram of a package cover plate according to another embodiment of the disclosure.

FIG. 3 is a schematic structural diagram of a package cover plate according to another embodiment of the disclosure. In an embodiment, as shown in FIG. 3, the lyophobic layer 323 may be on a side of the second spacer 322 facing away from the cover plate structure layer. The material of the lyophobic layer 323 may include a lyophobic material. Exemplarily, the material of the lyophobic layer 323 may include at least one of fluorinated polyimide, fluorinated polymethyl methacrylate, and polysiloxane.

In a possible implementation, the material of the first spacer may include a lyophobic material. Therefore, the first spacer is lyophobic, which can prevent water vapor remaining in the package cover plate from being transmitted to the auxiliary electrode layer through the first spacer, thereby preventing water vapor from corroding the top electrode and the organic functional layer of the OLED in the display substrate.

In a possible implementation, the material of the second spacer may include a lyophobic material. Therefore, the second spacer can form a barrier to prevent water vapor from passing through and corroding the auxiliary electrode layer, thereby preventing water vapor from corroding the top electrode and the organic functional layer in the display substrate. In addition, when the desiccant particles in the first spacer cannot completely absorb the residual water vapor, since the second spacer is lyophobic, the water vapor can be blocked from passing through the second spacer, avoiding water vapor remaining on the surface of the spacer structure and causing display defects. Moreover, the second spacer can also block external water vapor from entering the first spacer to prevent the desiccant particles in the first spacer from becoming failed due to the absorption of external water vapor, and to ensure that the desiccant particles are used to absorb the residual water vapor in the package cover plate.

The lyophobic material may include at least one of fluorinated polyimide, fluorinated polymethyl methacrylate, and polysiloxane.

Figure 4:
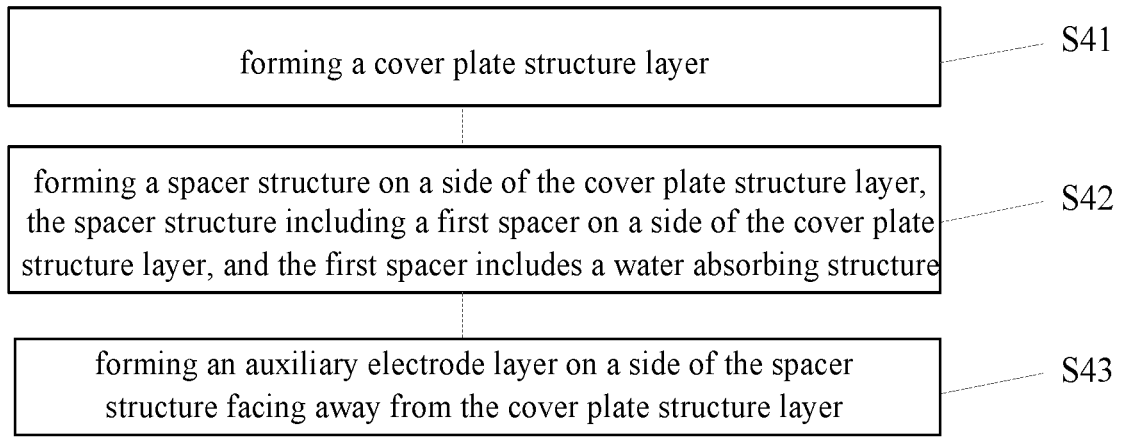
FIG. 4 is a schematic flow chart of a manufacturing method for a package cover plate according to an embodiment of the disclosure.

FIG. 4 is a schematic flow chart of a manufacturing method of a package cover plate according to an embodiment of the disclosure. As shown in FIG. 4, the manufacturing method of the package cover plate may include:

S41, forming a cover plate structure layer;

S42, forming a spacer structure on a side of the cover plate structure layer, the spacer structure including a first spacer on a side of the cover plate structure layer, and the first spacer including a water absorbing structure;

S43, forming an auxiliary electrode layer on a side of the spacer structure facing away from the cover plate structure layer.

The spacer structure is configured to block the diffusion of water vapor along the spacer structure toward the auxiliary electrode layer.

In an implementation, the step of forming a spacer structure on a side of the cover plate structure layer may include: forming a first spacer on a side of the cover plate structure layer, and the material of the first spacer being doped with desiccant particles. The desiccant particles are used to absorb water vapor.

In an implementation, the step of forming a spacer structure on a side of the cover plate structure layer may further include: forming a second spacer structure on a side of the first spacer facing away from the cover plate structure layer, an orthographic projection of the second spacer on the cover plate structure layer covering an orthographic projection of the first spacer on the cover plate structure layer; performing lyophobic treatment on at least a part of the second spacer to form a lyophobic layer on a side of the first spacer facing away from the cover plate structure layer.

In an implementation, at least one of tetrafluoromethane, fluorinated silane, and chlorosiloxane may be used to perform lyophobic treatment on the second spacer. For example, tetrafluoromethane plasma can be used to treat the surface of the second spacer that faces away from the first spacer.

In an implementation, the step of forming a spacer structure on a side of the cover plate structure layer may further include: forming a second spacer film on a side of the first spacer facing away from the cover plate structure layer; forming a lyophobic film on a side of the second spacer film facing away from the cover plate structure layer; and patterning the second spacer film and the lyophobic film to form a second spacer and a lyophobic layer, an orthographic projection of the second spacer on the cover plate structure layer covering an orthographic projection of the first spacer on the cover plate structure layer, and the lyophobic layer being on a side of the second spacer that faces away from the cover plate structure layer.

The technical solution of the embodiment of the present disclosure will be further described below through the preparation process of the package cover plate according to an embodiment of the present disclosure. It can be understood that, for the term "patterning" in this disclosure, when the patterned material is inorganic material or metal, the "patterning" includes coating photoresist, mask exposure, development, etching, stripping photoresist and other processes, and when the patterned material is organic material, "patterning" includes mask exposure, development and other processes. The evaporation, deposition, coating, and spreading mentioned in this disclosure are all mature preparation process in related technologies.

Figure 5:
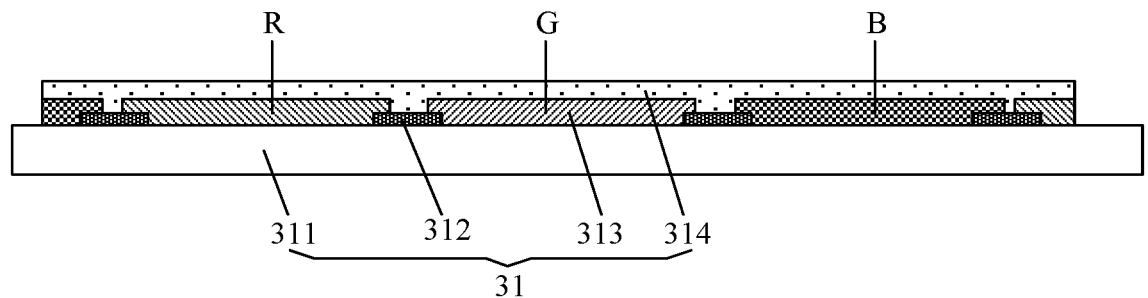
FIG. 5 is a schematic structural diagram of a package cover plate after forming a cover plate structure layer according to an embodiment of the disclosure.

The preparation process of the package cover plate may include:

S41, forming a cover plate structure layer. As shown in FIG. 5, which is a schematic structural diagram of a package cover plate after forming a cover plate structure layer according to an embodiment of the present disclosure. In an embodiment, as shown in FIG. 5, forming the cover plate structure layer 31 may include the following steps:

A black matrix film is coated on a side of the cover plate 311; and the black matrix film is patterned to form a black matrix 312. It can be understood that the black matrix 312 may correspond to the pixel defining layer in the display substrate that will be subsequently assembled with the package cover plate.

A color film structure layer 313 is formed on a side of the black matrix 312 facing away from the cover plate 311. The color film structure layer 313 may include a red color film, a green color film, and a blue color film. The process of forming a red color film may include: forming a film of a red color film on the side of the black matrix 312 facing away from the cover plate 311; patterning the film of the red color film to form a red (R) color film in the corresponding area. The formation process of the green (G) color film and the blue (B) color film is the same as that of the red color film, which will not be repeated herein. The color film structure layer is usually made of organic materials, and it is easy to accumulate water vapor during the process of forming the color film structure layer, and the water vapor will remain in the package cover plate.

A coating process (for example, a spin coating process) is used to form a planarization layer 314 on a side of the color film structure layer 313 facing away from the cover plate 311. The material of the planarization layer 314 may include a resin material with elasticity. Exemplarily, the material of the planarization layer 314 may include at least one of a phenol resin, a polypropylene resin, a polyimide resin, an acrylic resin, and the like. The planarization layer 314 covers the black matrix 312 and the color film structure layer 313, and the thickness of the planarization layer 314 can be any value from 1 μm to 2 μm (including endpoint values).

Figure 6:
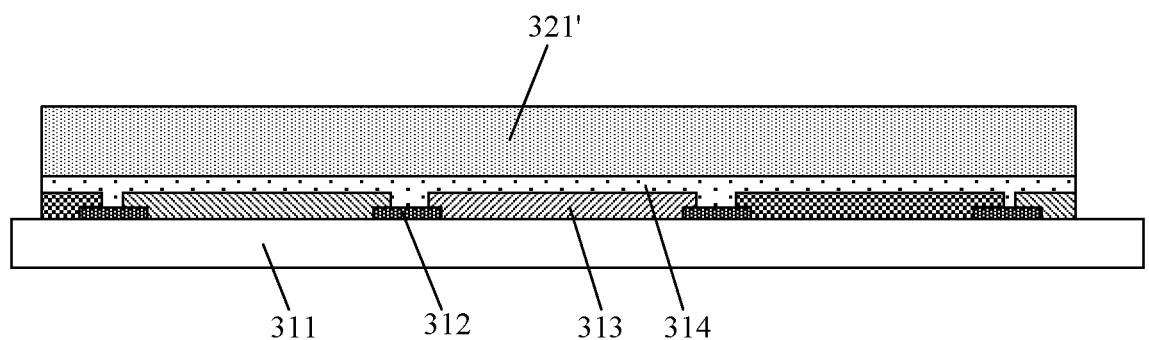
FIG. 6 is a schematic structural diagram of a package cover plate after forming a first spacer film according to an embodiment of the disclosure.

S42, forming a spacer structure on a side of the cover plate structure layer. In an embodiment, step S42 may include steps of S4211-S4215 as follows:

S4211, coating a first spacer film 321' on a side of the planarization layer 314 facing away from the cover plate 311, as shown in FIG. 6, which is a schematic structural diagram of a package cover plate after forming a first spacer film according to an embodiment of the disclosure. Exemplarily, the material of the first spacer film 321' may include an organic material and desiccant particles uniformly distributed in the organic material. The organic material may include at least one of polyimide, bisphenol A polycarbonate, a polymer containing an alkyl group in the main chain, a polymer containing a cyclic rigid structure in the main chain, and the like. The particle size of the desiccant particles may range from 20 nm to 50 nm. The desiccant particles may include at least one of calcium oxide (CaO) particles, barium oxide (BaO) particles, and calcium chloride ($CaCl_2$) particles. The volume ratio of the desiccant particles in the first spacer material may range from 20% to 40% (including endpoint values). The thickness of the first spacer film 321' may range from 2 μm to 8 μm (including endpoint values).

Figure 7:
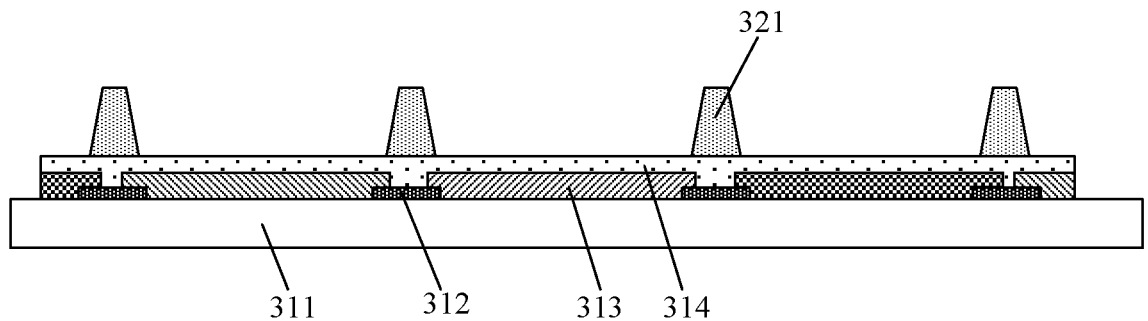
FIG. 7 is a schematic structural diagram of a package cover plate after forming a first spacer according to an embodiment of the disclosure.

S4212, performing a patterning process on the first spacer film to form a first spacer 321, as shown in FIG. 7, which is a schematic structural diagram of a package cover plate after forming a first spacer according to an embodiment of the disclosure. The first spacer 321 corresponds to the black matrix 312. The outer diameter of the first spacer 321 may range from 15 μm to 20 μm.

Figure 8:
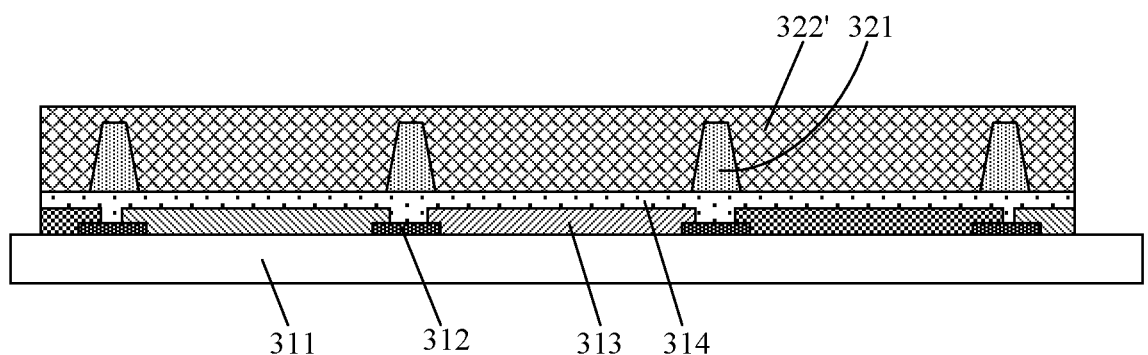
FIG. 8 is a schematic structural diagram of a package cover plate after forming a second spacer film according to an embodiment of the disclosure.

S4213, coating a second spacer film 322' on a side of the first spacer 321 facing away from the cover plate 311, as shown in FIG. 8, which is a schematic structural diagram of a package cover plate after forming a second spacer film according to an embodiment of the disclosure. The thickness of the second spacer film 322' is greater than the height of the first spacer 321, and the material of the second spacer film may include at least one of polyimide, polymethyl methacrylate, and organosilane. The thickness of the second spacer film may range from 5 μm to 10 μm (including endpoint values).

Figure 9:
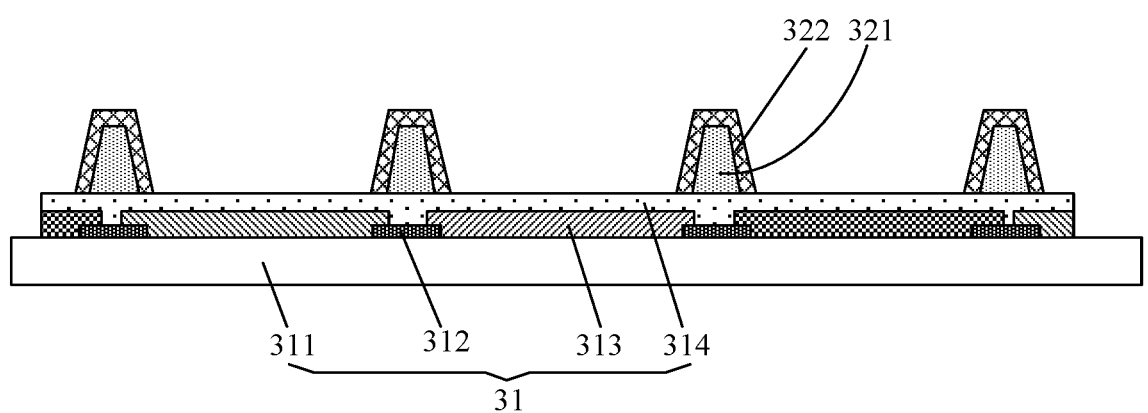
FIG. 9 is a schematic structural diagram of a package cover plate after forming a second spacer according to an embodiment of the disclosure.

S4214, performing a patterning process on the second spacer film to form a second spacer 322, as shown in FIG. 9, which is a schematic structural diagram of a package cover plate after forming a second spacer according to an embodiment of the disclosure. The orthographic projection of the second spacer 322 on the cover plate structure layer 31 covers the orthographic projection of the first spacer 321 on the cover plate structure layer 31. Exemplarily, the boundary of the orthographic projection of the second spacer 322 on the cover plate structure layer 31 is located outside the boundary of the orthographic projection of the first spacer 321 on the cover plate structure layer 31, so that the second spacer 322 covers the outer surface of the first spacer 321, and the outer diameter of the second spacer 322 may range from 20 μm to 30 μm.

Figure 10:
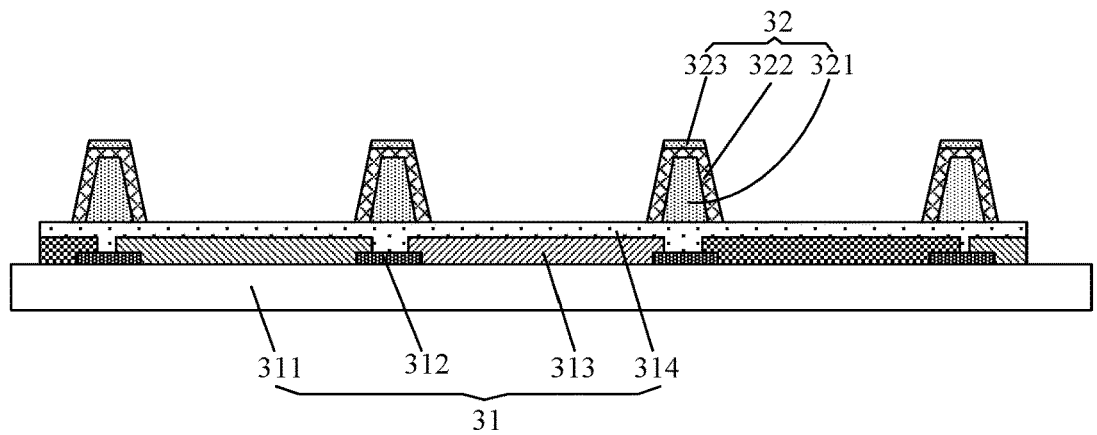
FIG. 10 is a schematic structural diagram of a package cover plate after forming a lyophobic layer according to an embodiment of the disclosure.

S4215, performing lyophobic treatment on at least a part of the surface of the second spacer 322 facing away from the first spacer 321 to form a lyophobic layer 323 on a side of the first spacer 321 facing away from the cover plate structure layer 31, as shown in FIG. 10, which is a schematic structural diagram of a package cover plate after forming a lyophobic layer according to an embodiment of the disclosure. Exemplarily, at least one of tetrafluoromethane, fluorinated silane, and chlorosiloxane can be used to perform lyophobic treatment on the second spacer 322. For example, tetrafluoromethane plasma can be used to treat the surface of the second spacer that faces away from the first spacer.

S43, forming an auxiliary electrode layer on a side of the spacer structure facing away from the cover plate structure layer, including: forming an auxiliary electrode film on the side of the spacer structure facing away from the cover plate structure layer by deposition, and then forming the auxiliary electrode layer 33, as shown in FIG. 2. The material of the auxiliary electrode layer 33 may include at least one of indium zinc oxide, indium tin oxide, and the like. The thickness of the auxiliary electrode layer 33 may range from 10 nm to 100 nm (including endpoint values).

In another implementation, step S42 may include the steps of S4221-S4224 as follows:

S4221 and S4222 are the same as S4211 and S4212 respectively, and will not be repeated herein.

Figure 11:
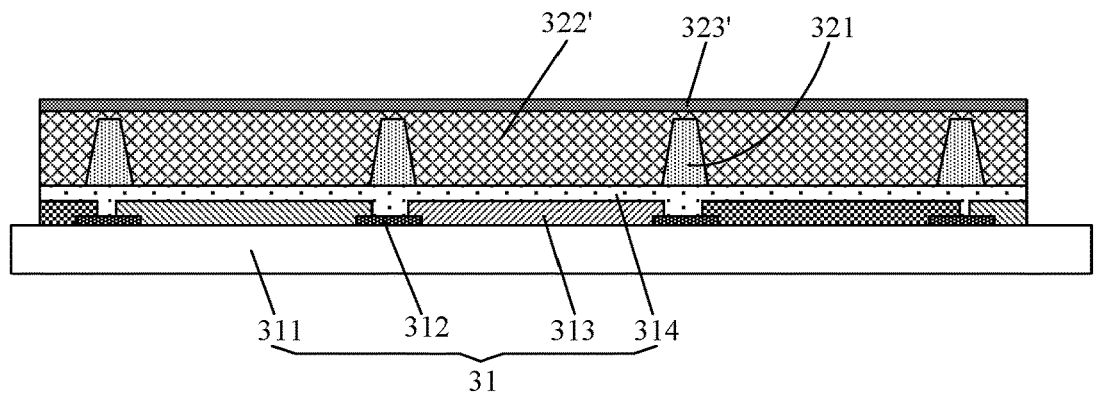
FIG. 11 is a schematic structural diagram of a package cover plate after forming a lyophobic film according to another embodiment of the disclosure.

S4223, sequentially forming a second spacer film 322' and a lyophobic film 323' on a side of the first spacer 321 facing away from the cover plate structure layer 31, as shown in FIG. 11, which is a schematic structural diagram of a package cover plate after forming a lyophobic film according to another embodiment of the present disclosure. Exemplarily, the second spacer film 322' may be formed by a coating process, and the lyophobic film 323' may be formed by a coating process. The thickness of the second spacer film 322' is greater than the height of the first spacer 321, and the material of the second spacer film may include at least one of polyimide, polymethyl methacrylate, and organosilane. The material of the lyophobic film 323' may include a lyophobic material. Exemplarily, the material of the lyophobic film 323' may include at least one of fluorinated polyimide, fluorinated polymethyl methacrylate, and polysiloxane.

Figure 12:
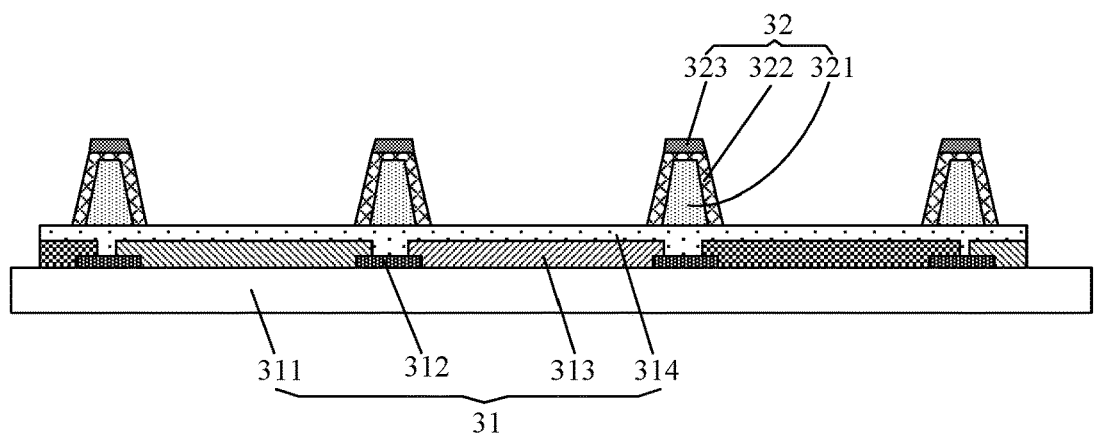
FIG. 12 is a schematic structural diagram of a package cover plate after forming a lyophobic layer according to another embodiment of the disclosure.

S4224, patterning the second spacer film 322' and the lyophobic film 323' to form the second spacer 322 and the lyophobic layer 323, as shown in FIG. 12, which is a schematic structural diagram of a package cover plate after forming a lyophobic layer according to another embodiment of the disclosure. The orthographic projection of the second spacer 322 on the cover plate structure layer covers the orthographic projection of the first spacer 321 on the cover plate structure layer. Exemplarily, the boundary of the orthographic projection of the second spacer 322 on the cover plate structure layer 31 is located outside the boundary of the orthographic projection of the first spacer 321 on the cover plate structure layer 31, so that the second spacer 322 covers the outer surface of the first spacer 321, and the lyophobic layer 323 is on the side of the second spacer 322 facing away from the cover plate structure layer.

By adopting the method of the embodiment of the present disclosure, the process of lyophobic treatment can be omitted, the manufacturing steps of the package cover plate can be reduced, and the manufacturing cost can be reduced.

Figure 13:
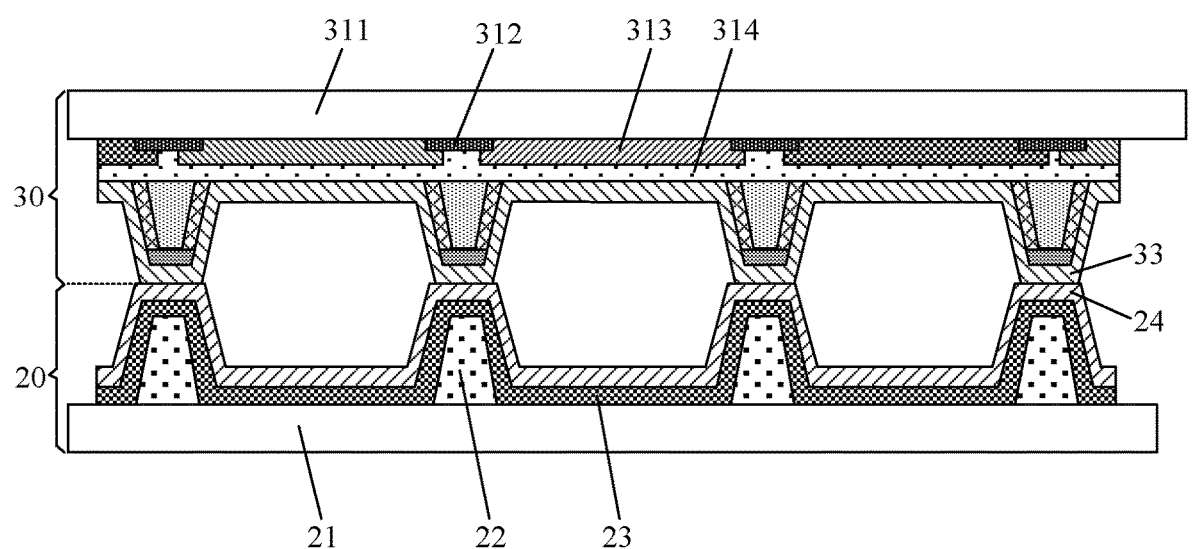
FIG. 13 is a schematic structural diagram of a display panel according to an embodiment of the disclosure.

FIG. 13 is a schematic structural diagram of a display panel according to an embodiment of the disclosure. Based on the foregoing embodiments, an embodiment of the present disclosure provides a display panel including the package cover plate 30 in any of the foregoing embodiments and a display substrate 20. The package cover plate 30 is arranged opposite to the display substrate 20. The display substrate 20 includes a top electrode 24 on a side facing the package cover plate 30. The auxiliary electrode layer 33 in the package cover plate 30 is coupled with the top electrode 24.

According to the display panel of the embodiment of the present disclosure, the spacer structure in the package cover plate 30 is configured to block the diffusion of water vapor along the spacer structure toward the auxiliary electrode layer 33. Therefore, the water vapor remaining in the package cover plate will not diffuse to the auxiliary electrode layer 33 along the spacer structure 32, and the water vapor will not diffuse to the top electrode 24 and the organic functional layer of the display substrate through the auxiliary electrode layer 33. In this way, the water vapor remaining in the package cover can be prevented from corroding the light emitting devices in the display substrate, black spots can be avoided, and the display effect and service life of the display panel can be improved.

In an implementation, the display substrate may include an OLED display substrate.

Based on the inventive concept of the foregoing embodiments, an embodiment of the present disclosure further provides a display device including the display panel adopting the foregoing embodiments. The display device can be any product or component with a display function, such as a mobile phone, a tablet computer, a television, a monitor, a notebook computer, a digital photo frame, a navigator, and so on.

In the description of the present disclosure, it should be understood that the orientation or positional relationship indicated by terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. is based on the orientation or positional relationship shown in the drawings, and is merely for convenience of describing the present disclosure and simplifying the description, but does not indicate or imply the indicated device or element must have a particular orientation, be constructed and operated in a particular orientation, and therefore should not be construed as limiting the present disclosure.

Furthermore, the terms "first" and "second" are used for descriptive purposes only, and are not to be construed as indicating or implying relative importance or implicitly indicating the number of indicated technical features. Thus, features defined as "first", "second" may explicitly or implicitly include one or more of the features. In the description of the present disclosure, the meaning of "plurality" is two or more than two, unless it is specifically defined otherwise.

In this disclosure, the terms "install", "attach", "connect", "fix", etc. should be understood broadly unless specifically stated and defined otherwise. For example, it can be a fixed connection, a detachable connection, or an integral connection; it can be a mechanical connection, or an electrical connection as well, or also a communication; it can be connected directly, or connected indirectly through an intermediary; it can be an internal connection of two elements or an interaction of two elements. Those skilled in the art can understand the specific meanings of the above terms in the present disclosure according to specific circumstances.

In the present disclosure, unless specifically stated and defined otherwise, the first feature "on" or "under" the second feature can be that the first and second features contact directly, or that the first and second features are contact indirectly via an intermediary instead of contacting directly. Moreover, the first feature "over" or "above" the second feature can be that the first feature directly above or diagonally above the second feature, or merely indicate that the first feature is higher in height than the second feature. The first feature "below" or "under" the second feature can be that the first feature directly below or diagonally below the second feature, or merely indicate that the first feature is lower in height than the second feature.

In the present disclosure, the first feature is "arranged corresponding to" the second feature means that the first feature and the second feature are substantially aligned in a direction perpendicular to a specific plane, that is, an orthographic projection of the first feature on the plane at least partially overlaps an orthographic projection of the second feature on the plane. For example, the orthographic projection of the first feature on the first plane completely overlaps the orthographic projection of the second feature on the first plane, the orthographic projection of the first feature on the first plane covers the orthographic projection of the second feature on the first plane, or the orthographic projection of the second feature on the first plane covers the orthographic projection of the first feature on the first plane, etc.

The above disclosure provides many different embodiments or examples for realizing different structures of the present disclosure. In order to simplify the present disclosure, the components and settings of specific examples are described above. Of course, they are only examples, and are not intended to limit the present disclosure. In addition, the present disclosure may repeat reference numerals and/or reference letters in different examples, and this repetition is for the purpose of simplification and clarity, and does not indicate the relationship between the various embodiments and/or settings discussed.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

The invention claimed is:

1. A package cover plate, comprising:
   a cover plate structure layer;
   a spacer structure on a side of the cover plate structure layer, wherein the spacer structure comprises a first spacer, and the first spacer comprises a water absorbing structure; and
   an auxiliary electrode layer on a side of the spacer structure facing away from the cover plate structure layer,
   wherein the spacer structure further comprises a lyophobic layer, and the lyophobic layer is on a side of the first spacer facing away from the cover plate structure layer.

2. The package cover plate of claim 1, wherein the water absorbing structure comprises a material of the first spacer doped with desiccant particles.

3. The package cover plate of claim 2,
   wherein a particle size of the desiccant particles ranges from 20 nm to 50 nm; and/or
   wherein the desiccant particles comprise at least one of calcium oxide particles, barium oxide particles, and calcium chloride particles; and/or
   wherein a volume ratio of the desiccant particles in the first spacer ranges from 20% to 40%.

4. The package cover plate of claim 1, wherein the first spacer has a columnar structure, an outer diameter of the first spacer ranges from 15 μm to 20 μm, and a height of the first spacer ranges from 2 μm to 8 μm.

5. The package cover plate of claim 1, wherein a material of the first spacer comprises a lyophobic material.

6. A display panel comprising a display substrate and the package cover plate of claim 1, the package cover plate being arranged opposite to the display substrate, and the display substrate comprising a top electrode on a side facing the package cover plate, and the auxiliary electrode layer in the package cover plate is coupled with the top electrode.

7. The display panel of claim 6,
wherein the water absorbing structure comprises a material of the first spacer doped with desiccant particles;
wherein a particle size of the desiccant particles ranges from 20 nm to 50 nm; and/or
wherein the desiccant particles comprise at least one of calcium oxide particles, barium oxide particles, or calcium chloride particles; and/or
wherein a volume ratio of the desiccant particles in the first spacer ranges from 20% to 40%.

8. A display device comprising the display panel of claim 6.

9. A package cover plate, comprising:
a cover plate structure layer;
a spacer structure on a side of the cover plate structure layer, wherein the spacer structure comprises a first spacer, and the first spacer comprises a water absorbing structure; and
an auxiliary electrode layer on a side of the spacer structure facing away from the cover plate structure layer,
wherein the spacer structure further comprises a second spacer, and the second spacer is on a side of the first spacer facing away from the cover plate structure layer, and an orthographic projection of the second spacer on the cover plate structure layer covers an orthographic projection of the first spacer on the cover plate structure layer.

10. The package cover plate of claim 9, wherein at least a part of a surface of the second spacer facing away from the first spacer comprises a lyophobic layer.

11. The package cover plate of claim 10,
wherein a material of the second spacer comprises at least one of polyimide, polymethyl methacrylate, and organosilane; and/or
wherein an outer diameter of the second spacer ranges from 20 μm to 30 μm; and/or
wherein a height of the second spacer ranges from 5 μm to 10 μm; and/or
wherein the lyophobic layer is a lyophobic structure obtained by using at least one of tetrafluoromethane, fluorinated silane, and chlorosiloxane to perform lyophobic treatment on at least a part of the surface of the second spacer that faces away from the first spacer.

12. The package cover plate of claim 9, wherein the spacer structure further comprises a lyophobic layer on a side of the second spacer facing away from the cover plate structure layer.

13. The package cover plate of claim 12,
wherein a material of the second spacer comprises at least one of polyimide, polymethyl methacrylate, or organosilane; and/or
wherein an outer diameter of the second spacer ranges from 20 μm to 30 μm; and/or
wherein a height of the second spacer ranges from 5 μm to 10 μm; and/or
wherein a material of the lyophobic layer comprises at least one of fluorinated polyimide, fluorinated polymethyl methacrylate, or polysiloxane.

14. The package cover plate of claim 9, wherein a material of the second spacer comprises a lyophobic material.

15. A manufacturing method for a package cover plate, comprising:
forming a cover plate structure layer;
forming a spacer structure on a side of the cover plate structure layer, the spacer structure comprising a first spacer on a side of the cover plate structure layer, the first spacer comprising a water absorbing structure, the water absorbing structure comprising a material of the first spacer doped with desiccant particles; and
forming an auxiliary electrode layer on a side of the spacer structure facing away from the cover plate structure layer,
wherein the forming a spacer structure on a side of the cover plate structure layer further comprises:
forming a second spacer on a side of the first spacer facing away from the cover plate structure layer, an orthographic projection of the second spacer on the cover plate structure layer covering an orthographic projection of the first spacer on the cover plate structure layer; and
performing lyophobic treatment on at least a part of a surface of the second spacer facing away from the first spacer to form a lyophobic layer on a side of the second spacer facing away from the cover plate structure layer,
wherein at least one of tetrafluoromethane, fluorinated silane, and chlorosiloxane is used to perform lyophobic treatment on the second spacer.

* * * * *